US007681777B2

(12) United States Patent
Hirata et al.

(10) Patent No.: US 7,681,777 B2
(45) Date of Patent: Mar. 23, 2010

(54) SOLDER PASTE AND PRINTED CIRCUIT BOARD

(75) Inventors: Masahiko Hirata, Kashiba (JP); Toshihiko Taguchi, Saitama (JP); Masanobu Okuyama, Mouka (JP); Yoshitaka Toyoda, Satte (JP)

(73) Assignees: Senju Metal Industry Co., Ltd., Tokyo (JP); Panasonic Corporation, Osaka (JP)

( * ) Notice: Subject to any disclaimer, the term of this patent is extended or adjusted under 35 U.S.C. 154(b) by 624 days.

(21) Appl. No.: 10/547,539

(22) PCT Filed: Mar. 31, 2004

(86) PCT No.: PCT/JP2004/004653

§ 371 (c)(1), (2), (4) Date: Jul. 28, 2006

(87) PCT Pub. No.: WO2004/089573

PCT Pub. Date: Oct. 21, 2004

(65) Prior Publication Data

US 2006/0261131 A1    Nov. 23, 2006

(30) Foreign Application Priority Data

Apr. 1, 2003    (JP) .............................. 2003-098405

(51) Int. Cl.
*B23K 35/14* (2006.01)
(52) U.S. Cl. ...................................... 228/56.3; 420/557
(58) Field of Classification Search ................ 228/56.3; 420/557, 559–562; 148/24
See application file for complete search history.

(56) References Cited

U.S. PATENT DOCUMENTS

| 2,950,184 | A | * | 8/1960 | Johnson ........................ 75/351 |
| 6,360,939 | B1 | | 3/2002 | Paruchuri et al. ......... 228/248.5 |
| 2001/0042779 | A1 | * | 11/2001 | Amita et al. ................. 228/224 |
| 2002/0015660 | A1 | * | 2/2002 | Murata et al. ................ 420/561 |
| 2003/0034381 | A1 | * | 2/2003 | Nakatsuka et al. ........ 228/180.1 |
| 2003/0230361 | A1 | * | 12/2003 | Takahashi ..................... 148/24 |
| 2006/0011702 | A1 | * | 1/2006 | Funaya et al. ............... 228/56.3 |

FOREIGN PATENT DOCUMENTS

| DE | 10153974 | | 5/2003 |
| EP | 0704272 | | 9/1995 |
| EP | 0855242 | | 9/1996 |
| JP | 09174278 | | 7/1997 |
| JP | 09277082 | | 10/1997 |
| JP | 09295182 | | 11/1997 |
| JP | 10249579 | | 9/1998 |
| JP | 11138292 | | 5/1999 |
| JP | 200403409 | * | 2/2004 |

OTHER PUBLICATIONS

Translation of JP 11-138292.*

* cited by examiner

*Primary Examiner*—Jessica L Ward
*Assistant Examiner*—Nicholas P D'Aniello
(74) *Attorney, Agent, or Firm*—Michael Tobias

(57) ABSTRACT

In a solder paste formed by blending an alloy powder and a flux, the alloy powder is a powder mixture formed by mixing at least one powder of a Sn—Zn based alloy and at least one powder of a Sn—Ag based alloy. The alloys powders are blended so that the composition of the powder mixture is 5-10 mass % of Zn; 0.005-1.5 mass % of Ag; optionally at least one of 0.002-1.0 mass % of Cu, 0.005-15 mass % of Bi, 0.005-15 mass % of In, and 0.005-1.0 mass % of Sb; and a remainder of Sn.

19 Claims, 1 Drawing Sheet

SOLDER PASTE AND PRINTED CIRCUIT BOARD

TECHNICAL FIELD

This invention relates to a solder paste for use in soldering electronic equipment and particularly to a solder paste having a solder powder which does not contain Pb. It also relates to a printed circuit board having soldered joints formed from the solder paste.

BACKGROUND ART

The reflow soldering method (also referred to below as the reflow method) is particularly suitable for soldering of electronic parts. The reflow method is a method in which a solder paste comprising a solder powder and a flux is applied to necessary locations of a printed circuit board (which typically have lands made of copper) by printing or discharging through a dispenser, and after electronic parts are mounted on the coated portions of the board, the board is heated in a heating apparatus called a reflow furnace to a temperature sufficient to melt the solder powder in the solder paste, thereby soldering the electronic parts to the printed circuit board.

The reflow method can not only perform soldering at a large number of locations in a single operation, but solder does not adhere to unnecessary locations, so it can perform soldering without forming bridges even with respect to electronic parts having a narrow pitch. In addition, the solder paste can temporarily secure the electronic parts, so it is not necessary to secure electronic parts with pins, and the solder paste contains a flux, so an operation of applying flux is unnecessary. Therefore, the reflow method has the advantages that it can perform soldering with excellent productivity and reliability, and it can easily cope with decreases in the size and increases in the density of electronic parts.

A conventional solder paste which is used in the reflow method has been prepared from a powder of a Pb—Sn alloy, a typical solder alloy which has been used from antiquity. A Pb—Sn alloy has a low melting point of 183° C. for the eutectic composition (Pb-63Sn), so it has little undesired thermal effect on electronic parts which are not resistant to heat. In addition, a Pb—Sn alloy has excellent solderability, and it causes little occurrence of soldering defects such as unsoldered portions and dewetting. However, out of concern for the toxicity of Pb, in the electronic equipment industry, there is a strong demand for so-called lead-free solder which does not contain Pb.

Typical lead-free solders are Sn-based solders containing Sn as a main component. Lead-free solders which are presently used include binary alloys such as Sn-3.5Ag (melting point of 221° C.), Sn-0.7Cu (melting point of 227° C.), Sn-9Zn (melting point of 199° C.), and Sn-58Bi (melting point of 139° C.), and these alloys to which one or more third elements such as Ag, Cu, Zn, Bi, In, Sb, Ni, Cr, Co, Fe, Mn, P, Ge, and Ga are added. These alloys can be collectively referred to as Sn—Ag, Sn—Cu, Sn—Bi, or Sn—Zn based alloys.

The term "based alloy" used herein includes the alloy itself and an alloy further containing one or more other elements. For example, a Sn—Zn based alloy includes Sn—Zn binary alloys and Sn—Zn alloys further containing at least one third element. Similarly, a Sn—Ag based alloy includes Sn—Ag binary alloys and Sn—Ag alloys further containing at least one third element.

A Sn—Ag based lead-free solder and a Sn—Cu based lead-free solder have a melting point of at least 220° C. even for a eutectic composition of a Sn—Ag or Sn—Cu alloy. Therefore, when these are formed into a solder paste and used in the reflow method, the peak temperature at the time of reflow soldering becomes at least 250° C., at which temperature there is the possibility of thermal damage to electronic parts and printed circuit boards.

A Sn—Bi based lead-free solder has a low melting point near 139° C. at the eutectic composition of a Sn—Bi alloy, and when it is used as a solder paste in the reflow method, the peak temperature is at most 200° C., so thermal effects on electronic parts and printed circuit boards are avoided. However, a lead-free solder containing a large amount of Bi has a melting point which is too low, so it has problems with respect to heat resistance. Namely, when the interior of the case of a piece of electronic equipment reaches a high temperature during use due to heat generated by coils, power transistors, and the like, soldered portions of a printed circuit board which is soldered using this lead-free solder have a decrease in bonding strength, and there is the possibility of peeling occurring. In addition, a lead-free solder containing a large amount of Bi, which is brittle, has another drawback that soldered joints can easily peel off when they receive even a small impact.

A Sn—Zn based lead-free solder has a melting point of 199° C. for a eutectic composition of a Sn—Zn alloy. This melting point is close to the melting point of a conventional Pb—Sn eutectic solder, so when a Sn—Zn based lead-free solder is formed into a solder paste and used in the reflow method, the peak temperature can be made 250° C. or less, and there is little thermal effect on electronic parts and printed circuit boards. However, a solder paste using a Sn-9Zn eutectic alloy has poor solderability with respect to portions to be soldered made of copper, so soldering defects may occur such as unsoldered portions, where solder does not adhere, or dewetting, in which portions are wet by solder but repel the solder. Such soldering defects not only reduce the bonding strength but worsen the external appearance.

In addition, when a long period of time has passed after soldering of copper lands of printed circuit boards or copper leads with a solder paste using a Sn-9Zn eutectic alloy, there are cases in which solder peels from the interface with copper foil or copper lands due to corrosion. Peeling of soldered joints is a cause of malfunctions in electronic equipment.

Furthermore, tombstoning in which minute chip parts stand up at the time of soldering can easily occur with a solder paste using a Sn-9Zn eutectic alloy. If tombstoning occurs on a printed circuit board, electronic equipment in which the printed circuit board is incorporated cannot function at all.

In order to reduce or eliminate the above-described problems of a Sn-9Zn eutectic alloy, various Sn—Zn based lead-free solders to which a third element is added have been proposed. For example, a solder paste using a lead-free solder to which Bi is added in order to improve solderability such as one having a composition of Sn-8Zn-3Bi or Sn-8Zn-3Bi-0.1 Ag is known in the art. In addition, a lead-free solder in which corrosion resistance is improved by adding Ag and/or Cu to an alloy having a composition close to the Sn-9Zn eutectic composition is disclosed in JP-A 9-94687.

A Sn—Zn based lead-free solder to which one or more of Bi, Ag, and Cu are added does indeed have the effect of improving solderability and resistance to peeling compared to a Sn-9Zn eutectic alloy when used in a solder paste in the reflow method. However, soldering defects and tombstoning can still occur.

Soldering defects and tombstoning occur with a Sn—Zn based lead-free solder because a Sn—Zn based alloy is a powder of only one type of alloy. This alloy powder becomes rounded at the start of melting, and the molten solder does not further wet and spread, and this causes soldering defects. In addition, this alloy powder melts within a short length of time during melting. Therefore, if the temperature at both ends of a chip is different at the time of reflow soldering (such as due to a temperature gradient or a change in the temperature within a furnace), the alloy on the end which melts first pulls on the chip by surface tension and tombstoning takes place.

In order to prevent soldering defects and tombstoning with a solder paste using a Sn—Zn based lead-free solder, a solder paste which uses a mixture of at least two lead-free solder powders (a powder mixture) having different compositions (different melting points) is disclosed in JP-A 9-277082. A solder paste using a mixture of at least two alloys each having a eutectic composition is disclosed in JP-A 11-138282, and a solder paste comprising a Sn—Ag alloy powder mixed with another alloy powder for improving wettability is disclosed in JP-A 9-295182.

With a solder paste using a powder mixture of at least two types of solder powder, the alloy powder having the lower melting point melts first, and the alloy powder having the higher melting point is present in its periphery, so the alloy powder having the lower melting point which melts first does not ball up, it adheres to the portion being soldered in this state, and good soldering is carried out. In a solder paste using a powder mixture, the alloy powder having a lower melting point melts first, and after a while, the alloy powder having the higher melting point melts. Accordingly, it takes time for the alloy powder having the higher melting point to completely melt, and during this period, even at the other end, the alloy powder having the lower melting point begins to melt, so tombstoning does not take place.

However, a solder paste using a powder mixture of conventional Sn—Zn based lead-free solders has the problem that minute solder balls are generated at portions being soldered at the time of reflow. In addition, with these solder pastes, the problem of peeling from portions being soldered made of copper after the passage of a long period of time due to corrosion remains unresolved.

Accordingly, there is still a need for a lead-free solder paste of a Sn—Zn based alloy which has good corrosion resistance and which does not produce minute solder balls at the time of reflow.

DISCLOSURE OF THE INVENTION

This invention relates to a solder paste formed by blending an alloy powder with a flux. The alloy powder used in the present invention is a powder mixture formed by mixing at least one type of Sn—Zn based alloy powder with at least one type of Sn—Ag based alloy powder. The two types of alloy powder are mixed so that the composition of the powder mixture is 5-10 mass % of Zn, 0.005-1.5 mass % of Ag, and a remainder of Sn. One or both of these alloy powders may include one or more alloying elements selected from Cu, Bi, In, and Sb.

Accordingly, generally, the present invention is a solder paste formed by blending an alloy powder and a flux, wherein the alloy powder is a powder mixture of at least one powder of a Sn—Zn based alloy (a Sn—Zn based alloy powder) selected from the group of the alloys Sn—Zn, Sn—Zn—Bi, Sn—Zn—In, Sn—Zn—Cu, Sn—Zn—Sb, Sn—Zn—Bi—In, Sn—Zn—Cu—Bi, Sn—Zn—Cu—In, Sn—Zn—Cu—Sb, Sn—Zn—Bi—Sb, Sn—Zn—In—Sb, Sn—Zn—Cu—Bi—In, Sn—Zn—Cu—Bi—Sb, Sn—Zn—Cu—In—Sb, Sn—Zn—Bi—In—Sb, and Sn—Zn—Cu—Bi—In—Sb, and at least one powder of a Sn—Ag based alloy (a Sn—Ag based alloy powder) selected from the group of the alloys Sn—Ag, Sn—Ag—Cu, Sn—Ag—Bi, Sn—Ag—In, Sn—Ag—Sb, Sn—Ag—Cu—Bi, Sn—Ag—Cu—In, Sn—Ag—Bi—In, Sn—Ag—Cu—Sb, Sn—Ag—Bi—Sb, Sn—Ag—In—Sb, Sn—Ag—Cu—Bi—In, Sn—Ag—Cu—Bi—Sb, Sn—Ag—Cu—In—Sb, Sn—Ag—Bi—In—Sb, and Sn—Ag—Cu—Bi—In—Sb.

These alloy powders are mixed so that the composition of the powder mixture is essentially 5-10 mass % of Zn, 0.005-1.5 mass % of Ag; optionally one or more of 0.002-1.0 mass % of Cu, 0.005-15 mass % of Bi, 0.005-15 mass % of In, and 0.005-1.0 mass % of Sb; and a remainder of Sn.

Here, the "composition of the powder mixture" means the composition when the powder mixture is melted to form a uniform melt.

The amount of a Sn—Ag based alloy powder in the powder mixture (the total amount thereof when using at least two Sn—Ag based alloy powders) is preferably at most 30 mass % of the powder mixture.

The present inventors found that peeling of soldered joints, which frequently occurs when a Sn—Zn based lead-free solder is used to form soldered joints on copper lands of a printed circuit board, is caused by the formation of a Cu—Zn alloy layer in the interface between the copper surface and the solder, as described below.

When a molten Sn-9Zn alloy adheres to the surface of copper lands of a printed circuit board to form solder fillets during soldering, a Cu—Zn alloy layer forms in the copper-solder interface due to the fact that Cu and Zn easily form an alloy. This alloy layer is exposed on the outer surface of each solder fillet which forms the foot of the fillet. If moisture contacts a portion of this alloy layer which is exposed to the exterior, the Zn in the alloy layer is selectively oxidized to convert into zinc oxide, which is the phenomenon called dezincification, resulting in a loss of bonding force of the solder joint in the affected portion. The dezincification of the Cu—Zn alloy layer gradually proceeds from the exposed exterior portion of the fillet to the inside of the fillet along the copper-solder interface, and ultimately the entire Cu—Zn alloy layer is dezincified, leading to peeling of the soldered joint (fillet) from the copper land.

On the other hand, when soldering onto copper is carried out with a Sn—Zn based lead-free solder containing Ag, a Cu—Zn—Ag alloy layer having a high melting point can form in the interface. This Cu—Zn—Ag alloy layer has stable bonds, and it becomes difficult for Zn to oxidize and dezincify. Accordingly, if soldering to copper is performed using a Sn—Zn based lead-free solder to which Ag is added (such as a Sn—Zn—Ag alloy), corrosion does not occur even over long periods, and soldered joints do not peel off. If Bi is further added to this alloy, it becomes difficult for soldering defects to occur. However, a solder paste using these alloy powders cannot prevent the formation of minute balls.

The reason why minute solder balls are formed with a solder paste using a Sn—Zn—Ag based alloy powder such as Sn—Zn—Ag or Sn—Zn—Ag—Bi is because a high melting point Zn—Ag intermetallic compound is already formed in these alloy powders. An alloy powder in which a Zn—Ag intermetallic compound is present has a high liquidus temperature, so it does not readily flow until it completely melts. When a solder paste is applied to a printed circuit board or when it undergoes preheating in a reflow furnace, it sags and flows outward with the flow of the flux, and it protrudes outward from the portion being soldered. At this time, a Sn—Zn—Ag based lead-free solder in which a Zn—Ag intermetallic compound is present does not readily flow at the time of reflow, so even if both the solder which extends to the exterior of the portion being soldered and the solder on the portion being soldered melt, the molten solder on the portion being soldered cannot pull in the molten solder extending to the exterior, so the solder on the exterior remains there and becomes solder balls.

According to the present invention, a solder paste using a powder mixture formed by mixing a Sn—Zn based alloy powder and a Sn—Ag based alloy powder does not have a Zn—Ag intermetallic compound present in either alloy, so its melting point is not so high, and it can readily flow at the time of melting. Accordingly, at the time of soldering, even if solder which extends to the exterior of the portion being soldered melts there, it is pulled back in by the solder which melts on the portion being soldered, so it does not become minute balls. With this solder paste comprising a powder mixture, a Zn—Ag intermetallic compound is formed when the two types of alloy powder melt together, but the Zn—Ag intermetallic compound which is formed after melting is in no way connected to the formation of minute balls. Moreover, when soldering onto a copper surface is performed, it alloys with copper present in the portion being soldered, and it forms a Cu—Zn—Ag intermetallic compound which has the effect of preventing corrosion, so corrosion resistance is further increased.

One or more third elements selected from Cu, Bi, In, and Sb may be added to one or both of a Sn—Zn based alloy powder and a Sn—Ag based alloy powder. The addition of Cu increases corrosion resistance, and it is also effective at improving reflow properties by lowering the melting temperature. The addition of Bi and/or In is effective at lowering the melting point of the alloy powder and improving solderability. Sb suppresses oxidation of Zn, so it has the effect of improving corrosion resistance.

The present invention also relates to a soldered joint formed by soldering using the above-described solder paste and a printed circuit board having a soldered joint formed by soldering using the above-described solder paste. Soldering is preferably carried out with respect to copper.

In the present invention, "printed circuit board" means both a printed circuit board (printed wiring board) on which electronic parts such as semiconductor packages are mounted and a circuit substrate on which semiconductor chips are mounted.

DETAILED EXPLANATION OF THE INVENTION

Figure 1:
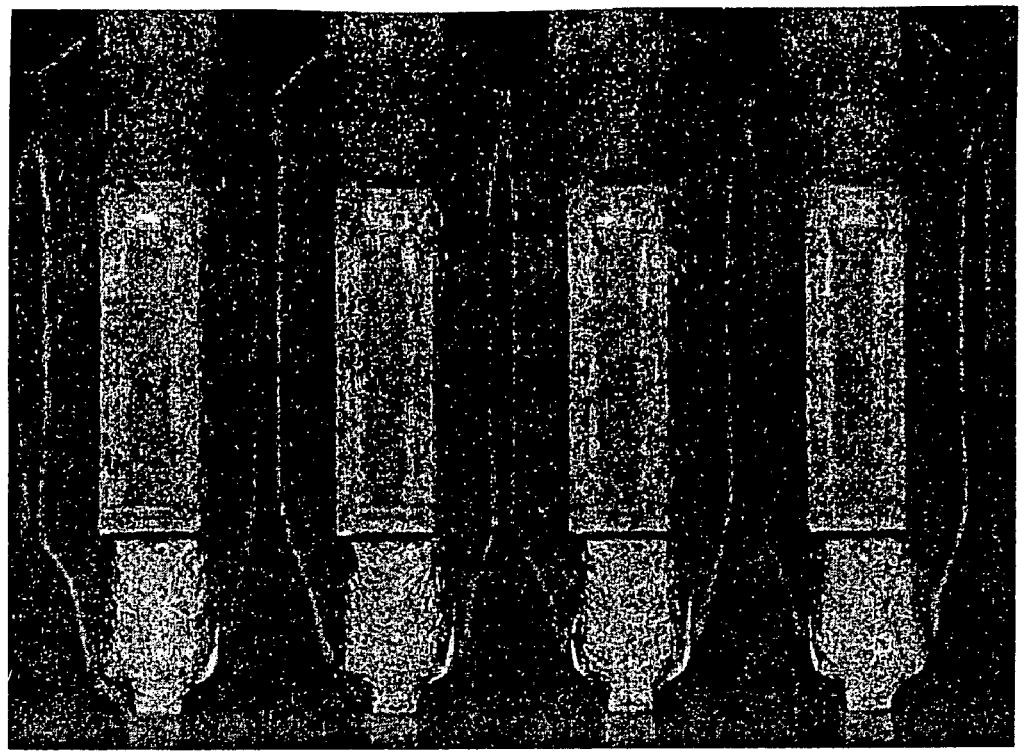
FIG. 1 is a photograph showing the state of minute ball formation in an embodiment.

A solder paste according to the present invention uses a Sn—Zn based alloy powder and a Sn—Ag based alloy powder which are mixed together.

The Sn—Zn based alloy powder is a powder of at least one alloy selected from the group of Sn—Zn, Sn—Zn—Bi, Sn—Zn—In, Sn—Zn—Cu, Sn—Zn—Sb, Sn—Zn—Bi—In, Sn—Zn—Cu—Bi, Sn—Zn—Cu—In, Sn—Zn—Cu—Sb, Sn—Zn—Bi—Sb, Sn—Zn—In—Sb, Sn—Zn—Cu—Bi—In, Sn—Zn—Cu—Bi—Sb, Sn—Zn—Cu—In—Sb, Sn—Zn—Bi—In—Sb, and Sn—Zn—Cu—Bi—In—Sb alloys.

The Sn—Ag based alloy powder is a powder of at least one alloy selected from the group of Sn—Ag, Sn—Ag—Cu, Sn—Ag—Bi, Sn—Ag—In, Sn—Ag—Sb, Sn—Ag—Cu—Bi, Sn—Ag—Cu—In, Sn—Ag—Bi—In, Sn—Ag—Cu—Sb, Sn—Ag—Bi—Sb, Sn—Ag—In—Sb, Sn—Ag—Cu—Bi—In, Sn—Ag—Cu—Bi—Sb, Sn—Ag—Cu—In—Sb, Sn—Ag—Bi—In—Sb, and Sn—Ag—Cu—Bi—In—Sb alloys.

In order to improve reflow properties, it is preferable for the melting temperature of the solder powder to be as low as possible. For this reason, the mixing ratio of the Sn—Zn based alloy powder is made such that the Zn content of the powder mixture (as stated above, the Zn content when the powder mixture is melted) is made 5-10 mass % so as to be near the eutectic composition. If the Zn content of the powder mixture is smaller than 5 mass % or larger than 10 mass %, the liquidus temperature of the solder increases, and the soldering temperature increases. The Zn content of the powder mixture is preferably 6-10 mass % and more preferably 7-9 mass %.

The mixing ratio of the Sn—Ag based alloy powder is made such that the Ag content in the powder mixture (as stated above, the Ag content when the powder mixture is melted) is 0.005-1.5 mass %. If the Ag content is smaller than 0.005 mass %, the effect of improving corrosion resistance after reflow is not sufficient. On the other hand, if the Ag content exceeds 1.5 mass %, a large amount of solder balls are formed at the time of reflow soldering, and reflow properties are deteriorated. The Ag content of the powder mixture is preferably 0.01-1.0 mass % and more preferably 0.05-0.5 mass %.

When each of the Sn—Ag and Sn—Zn based alloy powders is a powder of a binary alloy (i.e., a Sn—Ag alloy and a Sn—Zn alloy), it is preferable that the powder mixture have an Ag content of not greater than 0.3 mass % in order to improve reflow properties.

When Cu is added to a Sn—Zn based alloy powder, a powder of at least one alloy selected from the group of Sn—Zn—Cu, Sn—Zn—Cu—Bi, Sn—Zn—Cu—In, Sn—Zn—Cu—Sb, Sn—Zn—Cu—Bi—In, Sn—Zn—Cu—Bi—Sb, Sn—Zn—Cu—In—Sb, and Sn—Zn—Cu—Bi—In—Sb alloys can be used. When Cu is added to a Sn—Ag based alloy powder, a powder of at least one alloy selected from the group of Sn—Ag—Cu, Sn—Ag—Cu—Bi, Sn—Ag—Cu—In, Sn—Ag—Cu—Sb, Sn—Ag—Cu—Bi—In, Sn—Ag—Cu—Bi—Sb, Sn—Ag—Cu—In—Sb, and Sn—Ag—Cu—Bi—In—Sb alloys can be used.

When using at least one of these Cu-containing alloy powders, the mixing ratio is such that the content of Cu in the powder mixture is 0.002-1.0 mass %. If the Cu content of the powder mixture is smaller than 0.002 mass %, an effect of lowering the melting temperature of the powder mixture is not achieved. On the other hand, if the Cu content of the powder mixture exceeds 1.0 mass %, the liquidus temperature of the powder mixture increases, and the effect of lowering the melting temperature is suppressed. The Cu content is preferably 0.005-0.5 mass % and more preferably 0.01-0.3 mass %.

When Bi and/or In is added to the alloy powder, as a Sn—Zn based alloy, at least one of Sn—Zn—Bi, Sn—Zn—In, Sn—Zn—Bi—In, Sn—Zn—Cu—Bi, Sn—Zn—Cu—In, Sn—Zn—Bi—Sb, Sn—Zn—In—Sb, Sn—Zn—Cu—Bi—In, Sn—Zn—Cu—Bi—Sb, Sn—Zn—Cu—In—Sb, Sn—Zn—Bi—In—Sb, and Sn—Zn—Cu—Bi—In—Sb alloys can be used, and as a Sn—Ag based alloy, at least one of Sn—Ag—Bi, Sn—Ag—In, Sn—Ag—Cu—Bi, Sn—Ag—Cu—In, Sn—Ag—Bi—In, Sn—Ag—Bi—Sb, Sn—Ag—In—Sb, Sn—Ag—Cu—Bi—In, Sn—Ag—Cu—

Bi—Sb, Sn—Ag—Cu—In—Sb, Sn—Ag—Bi—In—Sb, and Sn—Ag—Cu—Bi—In—Sb alloys can be used.

When using at least one of these Bi- and/or In-containing alloy powders, the mixing ratio is such that the content of Bi and In of the powder mixture are each 0.005-15 mass %. If the content of either Bi or In is smaller than 0.005 mass %, an effect of reducing the melting temperature is not achieved. If the content thereof exceeds 15 mass %, the effect of the Sn—Bi eutectic temperature of 139° C. or the effect of the Sn—In eutectic temperature of 117° C. becomes large, so the heat resistance of the solder decreases, and there are cases in which the bonding strength of soldered joints decreases due to heat generated by heat generating parts. The content is preferably 0.01-5 mass %. When both Bi and In are added, the combined content of Bi and In in the powder is preferably 0.005-15 mass %.

When Sb is added to the alloy powder, a Sn—Zn based alloy can be at least one selected from the group of Sn—Zn—Sb, Sn—Zn—Cu—Sb, Sn—Zn—Bi—Sb, Sn—Zn—In—Sb, Sn—Zn—Cu—Bi—Sb, Sn—Zn—Cu—In—Sb, Sn—Zn—Bi—In—Sb alloys, and Sn—Zn—Cu—Bi—In—Sb, and a Sn—Ag based alloy can be at least one selected from the group of Sn—Ag—Sb, Sn—Ag—Cu—Sb, Sn—Ag—Bi—Sb, Sn—Ag—In—Sb, Sn—Ag—Cu—Bi—Sb, Sn—Ag—Cu—In—Sb, Sn—Ag—Bi—In—Sb, and Sn—Ag—Cu—Bi—In—Sb alloys.

When at least one of these Sb-containing alloy powders are used, the mixing ratio is such that the Sb content in the powder mixture is 0.005-1.0 mass %. If the Sb content of the powder mixture is less than 0.005 mass %, the effect of improving corrosion resistance is not achieved. On the other hand, if the Sb content exceeds 1.0 mass %, it has an adverse effect on wettability. The Sb content of the powder mixture is preferably 0.01-0.1 mass %.

In the present invention, the combination of a binary Sn—Zn alloy powder and a binary Sn—Ag alloy powder may be used. However, preferably at least one of the Sn—Zn based alloy powder and the Sn—Ag based alloy powder is a ternary or higher alloy powder containing at least one of the above-described alloying elements, since the reflow properties are improved and the formation of minute balls is reduced. The reason for this is thought to be that a ternary or higher alloy has a lower melting point than a binary alloy, and the separation between the solidus temperature and the liquidus temperature increases.

As explained below, the mixing ratio of the Sn—Zn based alloy powder and the Sn—Ag based alloy powder is preferably such that the proportion of the Sn—Ag based alloy powder in the powder mixture is at most 30 mass %.

When the reflow temperature of the solder paste is made at most 230° C. in consideration of thermal damage to electronic parts, the melting point of the Sn—Ag based alloy, which has a higher melting point than the Sn—Zn based alloy, may be at most 250° C. Even if the Sn—Ag based alloy has a melting point of 250° C., a powder of this alloy can melt at a reflow temperature of 230° C. because it is present in a solder paste in the form of the powder mixture. In the case of the powder mixture, if the Sn—Zn based alloy powder having a lower melting temperature first melts at a reflow temperature of at most 230° C., a melt of the lower melting point alloy which has melted spreads into the higher melting point Sn—Ag based alloy powder to cause the higher melting point alloy powder to melt. However, if the melting point of the higher melting point Sn—Ag alloy powder is too high, a long time is required until the higher melting point alloy powder melts by the above-described mechanism. Therefore, a melting point of at most 250° C. is suitable for the higher melting point Sn—Ag alloy powder. In order to make the melting point of the Sn—Ag alloy powder at most 250° C., the maximum added amount of Ag is made 5 mass %. On the other hand, in the present invention, the Ag content of the powder mixture in the present invention is at most 1.5 mass %. In order to make the Ag content of a powder mixture at most 1.5 mass % when the Ag content of the Sn—Ag alloy powder is at most 5 mass %, the proportion of the Sn—Ag based alloy powder is made at most 30 mass %.

A solder paste according to the present invention comprises a Sn—Zn based alloy powder and a Sn—Ag based alloy powder which are mixed in the above proportions. The average particle diameter of the alloy powders which are used is typically in the range of 10-50 micrometers. These powders can be manufactured by the gas atomizing method, for example.

The alloy powder mixture is blended with a flux to prepare a solder paste. Preferably, the flux which is used is one which has conventionally been used with a Sn—Zn based alloy powder to manufacture a solder paste. An example of such a flux is a rosin flux which contains an activator (e.g., an amine hydrobromide) and a thixotropic agent (e.g., hardened castor oil), although other fluxes may be employed. The flux may further contain one or more additives such as halogenated aliphatic or aromatic compound and surfactant, as described in JP-A 10-175092.

The mixing ratio of the alloy powder and the flux is selected so as to obtain a solder paste having a consistency suitable for application. For example, the alloy powder may constitute 80-95 mass %, preferably 85-95 mass %, of the solder paste.

A soldered joint or a printed circuit board formed by a reflow method using a solder paste according to the present invention is formed by soldering with a solder paste using a powder mixture of a Sn—Zn based alloy powder and a Sn—Ag based alloy powder, so it has excellent reliability without soldering defects or formation of minute balls.

EXAMPLES

Sn—Zn based alloy powders and Sn—Ag based alloy powders having the compositions shown in Tables 1 and 2 were obtained by the gas atomizing method. The average particle diameter of these alloy powders was in the range of 10-50 micrometers. These alloy powders were mixed in the mixing ratios shown in Tables 1 and 2, and the resulting powder mixture was blended with a polymerized rosin-based flux which contained diphenylguanidine HBr as an activator and hardened castor oil as a thixotropic agent in alpha-terpineol as a solvent to prepare a solder paste. Tables 1 and 2 also shows the composition of the alloy powder mixture (mixed powder).

The following properties of the solder pastes were investigated.

[Corrosion Resistance]

Test piece: A tough pitch copper plate measuring 0.3 mm×10 mm×15 mm was immersed to a depth of 15 mm in a molten solder alloy prepared by heating the powder mixture used for the solder paste to 250° C. to prepare a soldered test piece.

Test method: The soldered test piece was left for 1000 hours in a thermo-hygrostat having a temperature of 85° C. and a relative humidity of 85%, then it was immobilized in an epoxy potting resin, and the cross section was polished. The cross section was observed with a scanning electron microscope and an energy dispersive elementary analysis apparatus to determine whether there was any corrosion by oxidation in the interface of the soldered joint.

Results: The case in which the formation of an oxide layer due to corrosion by oxidation in the interface of the soldered joint was not observed or in which there was little formation of an oxide layer is indicated as good (acceptable), and the case in which there was much formation of an oxide layer due to corrosion by oxidation in the interface of the soldered joint or in which peeling of the interface was observed is indicated as poor (unacceptable).

[Reflow Properties]

Test piece: A solder paste was applied by printing using a metal screen having a thickness of 0.15 mm to a copper wiring printed circuit board having a QFP pattern with a pitch of 0.65 mm. After a QFP was mounted on the solder paste-coated circuit board, soldering was carried out by heating the board in a reflow furnace such that the peak temperature was 210-220° C. to obtain a test piece.

Results: The surface and the periphery of the soldered joint were observed for the extent of formation of minute balls. The standard for evaluation was follows. Excellent: extremely few minute balls, good: few minute balls, fair: some occurrence of minute balls, poor: much occurrence of minute balls. Those that were evaluated to be poor could not be used.

Figure 2:
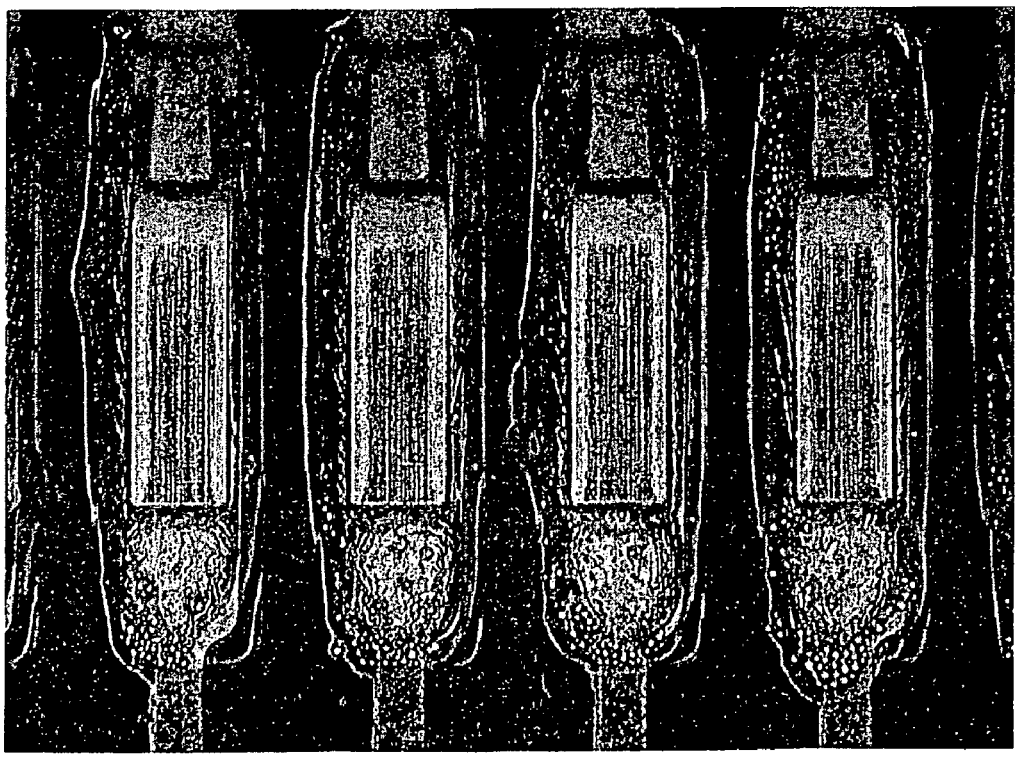
FIG. 2 is a photograph showing the state of minute ball formation in a comparative example.

FIG. 1 is a photograph showing the state of minute ball formation in Example 13, and FIG. 2 is a photograph showing the state of minute ball formation in Comparative Example 5. From the photographs of the state of minute ball formation, it can be seen that there was no formation of minute balls in the example, whereas a large number of minute balls were formed in the periphery of the soldered joint in the comparative example.

[QFP Bonding Strength]

Test piece: The test piece which was used for evaluation of reflow propertied and which was a copper wire printed circuit board to which QFP was soldered by the reflow method was also used to evaluate for the bonding strength of the soldered QFP.

Test method: The test piece was left for 1000 hours in a thermo-hygrostat having a temperature of 85° C. and a relative humidity of 85%. Thereafter, a tensile test was carried out at by pulling the test piece a sloping angle of 45° using a hook which had been engaged at a soldered lead of the QFP to determine the bonding strength, which was compared to the initial bonding strength measured in the same manner.

Results: A decrease in bonding strength was observed as corrosion by oxidation in the interface of the soldered joint proceeded, and the failure mode became peeling at the interface.

As can be seen from Tables 1 and 2, a solder paste prepared using a powder mixture of a Sn—Zn based alloy powder and a Sn—Ag based alloy powder according to the present invention had good corrosion resistance and good reflow properties. In addition, a soldered joint and a printed circuit board formed by soldering using this solder paste have good corrosion resistance, so they maintain a good bonding strength even after being left for 1000 hours under high temperature, high humidity conditions of 80° C. and a relative humidity of 85%, so they can withstand use over long periods.

Even though a solder paste according to present invention is a Sn—Zn based solder paste, it has good solderability, corrosion resistance, and reflow properties, so it provides the excellent effect not provided by conventional Sn—Zn baseds that defects such as unsoldered portions and dewetting do not occur at the time of soldering, an increase in lifespan can be achieved over long periods of use, and the formation of minute balls is extremely small. As a result, it can provide reliable soldered joints and printed circuit boards without soldering defects or minute balls.

TABLE 1

| | Composition of alloy powder (mass %) | | Mixing ratio (mass %) | |
| --- | --- | --- | --- | --- |
| Example | Sn—Zn based alloy | Sn—Ag based alloy | Sn—Zn based alloy | Sn—Ag based alloy |
| 1 | Sn—11Zn | Sn—3.5Ag | 91.0 | 9.0 |
| 2 | Sn—9Zn | Sn—3.5Ag | 99.7 | 0.3 |
| 3 | Sn—5Zn | Sn—3.5Ag | 99.7 | 0.3 |
| 4 | Sn—9Zn | Sn—3.5Ag | 97.1 | 2.9 |
| 5 | Sn—9Zn | Sn—3.5Ag | 99.85 | 0.15 |
| 6 | Sn—9Zn | Sn—4Ag—0.5Cu | 99.6 | 0.4 |
| 7 | Sn—9Zn | Sn—3Ag—0.5Cu | 96.7 | 3.3 |
| 8 | Sn—9Zn | Sn—3.5Ag—1Cu | 71.0 | 29.0 |
| 9 | Sn—9Zn | Sn—4Ag—0.5Cu | 75.0 | 25.0 |
| 10 | Sn—9Zn—1Cu | Sn—3.5Ag—1Cu | 80.0 | 20.0 |
| 11 | Sn—9Zn | Sn—3.5Ag—2Bi | 99.7 | 0.3 |
| 12 | Sn—9Zn | Sn—3.5Ag—2Bi | 71.0 | 29.0 |
| 13 | Sn—8Zn—3Bi | Sn—3.5Ag | 97.1 | 2.9 |
| 14 | Sn—9Zn | Sn—1Ag—57Bi | 90.0 | 10.0 |
| 15 | Sn—8Zn—3Bi | Sn—3.5Ag—2Bi | 98.6 | 1.4 |
| 16 | Sn—8Zn—3In | Sn—3.5Ag | 97.1 | 2.9 |
| 17 | Sn—9Zn | Sn—1Ag—50In | 90.0 | 10.0 |
| 18 | Sn—9Zn | Sn—3.5Ag—2In | 99.7 | 0.3 |
| 19 | Sn—8Zn—3Bi—0.1Cu | Sn—3Ag—0.5Cu | 96.7 | 3.3 |
| 20 | Sn—9Zn | Sn—2Ag—0.5Cu—15Bi | 75.0 | 25.0 |
| 21 | Sn—8Zn—12Bi | Sn—2Ag—0.5Cu—25Bi | 80.0 | 20.0 |
| 22 | Sn—9Zn | Sn—3Ag—0.7Cu—5In | 96.7 | 3.3 |
| 23 | Sn—8Zn—12In | Sn—2Ag—0.5Cu—25In | 80.0 | 20.0 |
| 24 | Sn—8Zn—3In—0.1Cu | Sn—3Ag—0.5Cu | 96.7 | 3.3 |
| 25 | Sn—9Zn | Sn—3.5Ag—0.5Bi—8In | 97.1 | 2.9 |
| 26 | Sn—9Zn | Sn—3.5Ag—0.5Bi—8In | 71.0 | 29.0 |

TABLE 1-continued

| | | | | |
|---|---|---|---|---|
| 27 | Sn—8Zn—3In | Sn—3.5Ag—2Bi | 97.1 | 2.9 |
| 28 | Sn—8Zn—3Bi—3In | Sn—3.5Ag—0.5Bi—8In | 97.1 | 2.9 |
| 29 | Sn—8Zn—3Bi | Sn—3Ag—0.7Cu—1In | 83.3 | 16.7 |
| 30 | Sn—9Zn | Sn—3Ag—0.7Cu—1Bi—2.5In | 93.0 | 7.0 |
| 31 | Sn—8Zn—3Bi—3In—0.1Cu | Sn—3Ag—0.5Cu | 96.7 | 3.3 |
| 32 | Sn—9Zn | Sn—3.4Ag—3Sb | 95.0 | 5.0 |
| 33 | Sn—9Zn | Sn—0.3Ag—0.7Cu—0.3Sb | 98.3 | 1.7 |

| | Composition of mixed powder (mass %) | | | | | | Properties | | QFP bond strength (N) | |
|---|---|---|---|---|---|---|---|---|---|---|
| Example | Sn | Ag | Zn | Cu | Bi | In | Sb | CR.* | Reflow | Initial | After 1000 hr |
| 1 | bal. | 0.3 | 10.0 | | | | | Good | Fair | 25.9 | 23.2 |
| 2 | bal. | 0.01 | 9.0 | | | | | Good | Good | 26.4 | 16.9 |
| 3 | bal. | 0.01 | 5.0 | | | | | Good | Fair | 25.3 | 16.4 |
| 4 | bal. | 0.1 | 8.7 | | | | | Good | Good | 28.3 | 25.0 |
| 5 | bal. | 0.005 | 9.0 | | | | | Good | Good | 26.1 | 15.1 |
| 6 | bal. | 0.02 | 9.0 | 0.002 | | | | Good | Exel. | 25.8 | 17.1 |
| 7 | bal. | 0.1 | 8.7 | 0.02 | | | | Good | Exel. | 28.6 | 24.3 |
| 8 | bal. | 1 | 6.4 | 0.3 | | | | Good | Fair | 29.5 | 26.8 |
| 9 | bal. | 1 | 6.8 | 0.1 | | | | Good | Fair | 29.2 | 26.5 |
| 10 | bal. | 0.7 | 7.2 | 1.0 | | | | Good | Fair | 28.5 | 25.5 |
| 11 | bal. | 0.01 | 9.0 | 0.006 | | | | Good | Exel. | 26.1 | 17.3 |
| 12 | bal. | 1 | 6.4 | 0.6 | | | | Good | Fair | 29.9 | 25.3 |
| 13 | bal. | 0.1 | 7.8 | 2.9 | | | | Good | Exel. | 31.5 | 20.3 |
| 14 | bal. | 0.1 | 8.1 | 5.7 | | | | Good | Exel. | 33.1 | 19.6 |
| 15 | bal. | 0.05 | 7.9 | 3.0 | | | | Good | Exel. | 30.6 | 18.9 |
| 16 | bal. | 0.1 | 7.8 | | 2.9 | | | Good | Exel. | 30.2 | 23.4 |
| 17 | bal. | 0.1 | 8.1 | | | 5.0 | | Good | Exel. | 30.8 | 21.1 |
| 18 | bal. | 0.01 | 9.0 | | | 0.0 | | Good | Exel. | 25.7 | 17.5 |
| 19 | bal. | 0.1 | 7.7 | 0.1 | 2.9 | | | Good | Exel. | 30.3 | 23.4 |
| 20 | bal. | 0.5 | 6.8 | 0.1 | 3.8 | | | Good | Good | 32.6 | 23.5 |
| 21 | bal. | 0.4 | 6.4 | 0.1 | 15.0 | | | Good | Exel. | 28.1 | 22.0 |
| 22 | bal. | 0.1 | 8.7 | 0.02 | | 0.17 | | Good | Exel. | 29.2 | 22.4 |
| 23 | bal. | 0.4 | 6.4 | 0.1 | | 15.0 | | Good | Exel. | 27.3 | 22.5 |
| 24 | bal. | 0.1 | 7.7 | 0.1 | | 2.9 | | Good | Exel. | 28.6 | 21.9 |
| 25 | bal. | 0.1 | 8.7 | | 0.01 | 0.2 | | Good | Exel. | 29.4 | 23.7 |
| 26 | bal. | 1 | 6.4 | | 0.1 | 2.3 | | Good | Exel. | 29.3 | 27.2 |
| 27 | bal. | 0.1 | 7.8 | | 0.1 | 2.9 | | Good | Exel. | 30.5 | 23.1 |
| 28 | bal. | 0.1 | 7.8 | | 2.9 | 3.1 | | Good | Exel. | 32.7 | 20.8 |
| 29 | bal. | 0.5 | 6.7 | 0.1 | 2.5 | 0.2 | | Good | Exel. | 29.8 | 23.8 |
| 30 | bal. | 0.2 | 8.4 | 0.05 | 0.07 | 0.2 | | Good | Exel. | 28.5 | 21.6 |
| 31 | bal. | 0.1 | 7.7 | 0.1 | 2.9 | 2.9 | | Good | Exel. | 32.6 | 24.0 |
| 32 | bal. | 0.17 | 8.6 | | | | 0.15 | Good | Good | 27.9 | 24.9 |
| 33 | bal. | 0.005 | 8.8 | 0.01 | | | 0.005 | Good | Good | 25.8 | 17.6 |

CR.*: Corrosion Resistance

TABLE 2

| | Composition of alloy powder (mass %) | | Mixing ratio (mass %) | |
|---|---|---|---|---|
| | Sn—Zn based alloy | Sn—Ag based alloy | Sn—Zn based alloy | Sn—Ag based alloy |
| Example | | | | |
| 34 | Sn—9Zn | Sn—3.4Ag—0.7Cu—0.3Sb | 95.0 | 5.0 |
| 35 | Sn—8Zn—3Bi | Sn—3.4Ag—3Sb | 98.3 | 1.7 |
| 36 | Sn—8Zn—3Bi | Sn—3Ag—3Bi—1Sb | 95.0 | 5.0 |
| 37 | Sn—11Zn | Sn—3.5Ag—15In—0.3Sb | 70.0 | 30.0 |
| 38 | Sn—8Zn—3Bi—0.1Cu—0.05Sb | Sn—3Ag—0.5Cu | 95.0 | 5.0 |
| 39 | Sn—8Zn—3Bi | Sn—3.5Ag—1Cu—0.5Bi—4Sb | 97.5 | 2.5 |
| 40 | Sn—8Zn—3Bi—0.8Sb | Sn—1Ag—1Cu—3Sb | 95.0 | 5.0 |
| 41 | Sn—8Zn—3In—0.05Sb | Sn—3Ag—0.5Cu | 95.0 | 5.0 |
| 42 | Sn—8Zn—3In—0.1Cu—0.05Sb | Sn—3Ag—0.5Cu | 95.0 | 5.0 |
| 44 | Sn—9Zn—0.05Sb | Sn—3.5Ag—0.5Bi—8In | 95.0 | 5.0 |
| 43 | Sn—9Zn | Sn—3.5Ag—0.5Bi—8In—0.5Sb | 95.0 | 5.0 |
| 45 | Sn—8Zn—3Bi | Sn—3.5Ag—0.7Cu—1.5In—1.5Sb | 98.5 | 1.5 |
| 46 | Sn—8Zn—3Bi | Sn—3Ag—0.7Cu—1Bi—2.5In—0.5S | 95.0 | 5.0 |
| 47 | Sn—9Zn—0.1Cu—0.05Sb | Sn—3.5Ag—0.5Bi—8In | 95.0 | 5.0 |
| 48 | Sn—8Zn—3Bi—3In—0.05Sb | Sn—3Ag—0.5Cu | 95.0 | 5.0 |
| 49 | Sn—8Zn—3Bi—3In—0.1Cu—0.05Sb | Sn—3Ag—0.5Cu | 95.0 | 5.0 |

TABLE 2-continued

Comparative

| # | | | | |
|---|---|---|---|---|
| 1 | Sn—9Zn | — | 0.0 | 100.0 |
| 2 | Sn—8Zn—3Bi | — | 0.0 | 100.0 |
| 3 | Sn—9Zn—0.01Ag | — | 0.0 | 100.0 |
| 4 | Sn—9Zn—0.1Ag | — | 0.0 | 100.0 |
| 5 | Sn—9Zn—1Ag | — | 0.0 | 100.0 |
| 6 | Sn—8Zn—3Bi—0.1Ag | — | 0.0 | 100.0 |
| 7 | Sn—14Zn | Sn—3.5Ag | 99.7 | 0.3 |
| 8 | Sn—3Zn | Sn—3.5Ag | 99.7 | 0.3 |
| 9 | Sn—9Zn | Sn—3Ag | 99.9 | 0.1 |
| 10 | Sn—11Zn | Sn—7Ag | 75.0 | 25.0 |
| 11 | Sn—9Zn | Sn—3.5Ag | 30.0 | 70.0 |
| 12 | Sn—9Zn | Sn—5Ag | 60.0 | 40.0 |
| 13 | Sn—9Zn—1Cu | Sn—3.5Ag—1.5Cu | 75.0 | 25.0 |
| 14 | Sn—9Zn | Sn—3Ag—3Sb | 99.9 | 0.1 |
| 15 | Sn—8Zn—3Bi | Sn—3Sb | 96.7 | 3.3 |
| 16 | Sn—8Zn—3Bi—0.8Sb | Sn—1Ag—1Cu—5Sb | 90.0 | 10.0 |

| | Composition of mixed powder (mass %) | | | | | | | Properties | | |
|---|---|---|---|---|---|---|---|---|---|---|
| | Sn | Ag | Zn | Cu | Bi | In | Sb | CR.* | Reflow | QFP bond strength (N) Initial | After 1000 hr |

Example

| # | Sn | Ag | Zn | Cu | Bi | In | Sb | CR.* | Reflow | Initial | After 1000 hr |
|---|---|---|---|---|---|---|---|---|---|---|---|
| 34 | bal. | 0.17 | 8.60 | 0.04 | | | 0.015 | Good | Good | 26.4 | 24.2 |
| 35 | bal. | 0.06 | 7.8 | | 2.9 | | 0.05 | Good | Exel. | 29.1 | 26.0 |
| 36 | bal. | 0.15 | 7.6 | | 3.0 | | 0.05 | Good | Exel. | 31.2 | 27.4 |
| 37 | bal. | 1.1 | 7.7 | | | 4.5 | 0.09 | Good | Exel. | 29.3 | 25.8 |
| 38 | bal. | 0.15 | 7.6 | 0.1 | 2.9 | | 0.05 | Good | Exel. | 31.8 | 26.6 |
| 39 | bal. | 0.09 | 7.8 | 0.03 | 0.7 | | 0.1 | Good | Exel. | 29.5 | 26.5 |
| 40 | bal. | 0.05 | 7.6 | 0.05 | 2.9 | | 0.9 | Good | Good | 30.4 | 27.8 |
| 41 | bal. | 0.15 | 7.6 | 0.03 | | 2.9 | 0.05 | Good | Exel. | 28.3 | 24.5 |
| 42 | bal. | 0.15 | 7.6 | 0.1 | | 2.9 | 0.05 | Good | Exel. | 29.8 | 25.7 |
| 44 | bal. | 0.18 | 8.6 | | 0.03 | 0.4 | 0.05 | Good | Exel. | 28.1 | 23.9 |
| 43 | bal. | 0.18 | 8.6 | | 0.03 | 0.4 | 0.03 | Good | Exel. | 29.0 | 25.0 |
| 45 | bal. | 0.05 | 7.9 | 0.01 | 3.0 | 0.02 | 0.02 | Good | Exel. | 29.6 | 22.3 |
| 46 | bal. | 0.15 | 7.6 | 0.04 | 2.9 | 0.13 | 0.03 | Good | Exel. | 29.9 | 25.1 |
| 47 | bal. | 0.18 | 8.6 | 0.1 | 0.03 | 0.4 | 0.05 | Good | Exel. | 29.5 | 24.7 |
| 48 | bal. | 0.15 | 7.6 | 0.03 | 2.9 | 2.9 | 0.05 | Good | Exel. | 32.6 | 27.1 |
| 49 | bal. | 0.15 | 7.6 | 0.1 | 2.9 | 2.9 | 0.05 | Good | Exel. | 33.0 | 26.5 |

Comparative

| # | Sn | Ag | Zn | Cu | Bi | In | Sb | CR.* | Reflow | Initial | After 1000 hr |
|---|---|---|---|---|---|---|---|---|---|---|---|
| 1 | bal. | | 9 | | | | | Poor | Exel. | 25.7 | 10.5 |
| 2 | bal. | | 8 | 3.0 | | | | Poor | Exel. | 29.3 | 9.1 |
| 3 | bal. | 0.01 | 9 | | | | | Good | Poor | 26.2 | 17.3 |
| 4 | bal. | 0.1 | 9 | | | | | Good | Poor | 28.4 | 24.3 |
| 5 | bal. | 1 | 9 | | | | | Good | Poor | 29.6 | 26.7 |
| 6 | bal. | 0.1 | 8 | | 3 | | | Good | Poor | 31.7 | 21.1 |
| 7 | bal. | 0.01 | 14 | | | | | Good | Poor | 27.6 | 24.4 |
| 8 | bal. | 0.01 | 3.0 | | | | | Good | Poor | 25.2 | 19.8 |
| 9 | bal. | 0.003 | 9.0 | | | | | Poor | Good | 26.4 | 10.9 |
| 10 | bal. | 1.8 | 8.3 | | | | | Good | Poor | 25.5 | 22.6 |
| 11 | bal. | 2.5 | 2.7 | | | | | Good | Poor | 25.6 | 23.4 |
| 12 | bal. | 2 | 5.4 | | | | | Good | Poor | 26.3 | 23.8 |
| 13 | bal. | 0.9 | 6.8 | 1.1 | | | | Good | Poor | 27.7 | 23.8 |
| 14 | bal. | 0.003 | 9.0 | | | | 0.003 | Poor | Fair | 26.1 | 12.3 |
| 15 | bal. | | 7.7 | | 2.9 | | 0.1 | Poor | Good | 31.3 | 11.2 |
| 16 | bal. | 0.05 | 7.6 | 0.05 | 2.9 | | 1.2 | Good | Poor | 30.3 | 27.1 |

CR.*: Corrosion Resistance

The invention claimed is:

1. A solder paste comprising an alloy powder blended with a flux, wherein the alloy powder is a powder mixture consisting of a plurality of powders each of which is a Sn—Zn based alloy powder not containing Ag or a Sn—Ag based alloy not containing Zn, each of the plurality of powders is selected from a Sn—Zn binary alloy powder, a Sn—Zn—Bi ternary alloy powder, a Sn—Zn—In ternary alloy powder, a Sn—Zn—Cu ternary alloy powder, a Sn—Zn—Sb ternary alloy powder, a Sn—Zn—Bi—In quaternary alloy powder, a Sn—Zn—Cu—Bi quaternary alloy powder, a Sn—Zn—Cu—In quaternary alloy powder, a Sn—Zn—Cu—Sb quaternary alloy powder, a Sn—Zn—Bi—Sb quaternary alloy powder, a Sn—Zn—In—Sb quaternary alloy powder, a Sn—Zn—Cu—Bi—In five-element alloy powder, a Sn—Zn—Cu—Bi—Sb five-element alloy powder, a Sn—Zn—Cu—In—Sb five-element alloy powder, a Sn—Zn—Bi—In—Sb five-element alloy powder, a Sn—Zn—Cu—Bi—In—Sb six-element alloy powder, a Sn—Ag binary alloy powder, a Sn—Ag—Cu ternary alloy powder, a Sn—Ag—In ternary alloy powder, a Sn—Ag—Sb ternary alloy powder, a Sn—Ag—Cu—Bi quaternary alloy powder, a Sn—Ag—Cu—In quaternary alloy powder, a Sn—Ag—Bi—In quaternary alloy powder, a Sn—Ag—

Cu—Sb quaternary alloy powder, a Sn—Ag—Bi—Sb quaternary alloy powder, a Sn—Ag—In—Sb quaternary alloy powder, a Sn—Ag—Cu—Bi—In five-element alloy powder, a Sn—Ag—Cu—Bi—Sb five-element alloy powder, a Sn—Ag—Cu—In—Sb five-element alloy powder, a Sn—Ag—Bi—In—Sb five-element alloy powder, and a Sn—Ag—Cu—Bi—In—Sb six-element alloy powder, and the composition of the powder mixture consists of 5-10 mass % of Zn, 0.005-1.5 mass % of Ag, one or more selected from the group consisting of 0.002-1.0 mass % of Cu, 0.005-15 mass % of Si, 0.005-15 mass % of In, and 0.005-1.0 mass % of Sb, and a remainder of Sn.

2. A solder paste as claimed in claim 1 wherein each powder in the powder mixture is selected from a Sn—Zn binary alloy powder, a Sn—Zn—Cu ternary alloy powder, a Sn—Ag binary alloy powder, and a Sn—Ag—Cu ternary alloy powder, and the composition of the powder mixture consists of 5-10 mass % of Zn, 0.005-1.5 mass % of Ag, 0.002-1.0 mass % of Cu, and a remainder of Sn.

3. A solder paste as claimed in claim 1 wherein each powder in the powder mixture is selected from a Sn—Zn binary alloy powder, a Sn—Zn—Bi ternary alloy powder, and a Sn—Ag binary alloy powder, and the composition of the powder mixture consists of 5-10 mass % of Zn, 0.005-1.5 mass % of Ag, 0.005-15 mass % of Bi, and a remainder of Sn.

4. A solder paste as claimed in claim 1 wherein each powder in the powder mixture is selected from a Sn—Zn binary alloy powder, a Sn—Zn—In ternary alloy powder, a Sn—Ag binary alloy powder, and a Sn—Ag—In ternary alloy powder, and the composition of the powder mixture consists of 5-10 mass % of Zn, 0.005-1.5 mass % of Ag, 0.005-15 mass % of In, and a remainder of Sn.

5. A solder paste as claimed in claim 1 wherein each powder in the powder mixture is selected from a Sn—Zn binary alloy powder, a Sn—Zn—Bi ternary alloy powder, a Sn—Zn—Cu ternary alloy powder, a Sn—Zn—Cu—Bi quaternary alloy powder, a Sn—Ag binary alloy powder, a Sn—Ag—Cu ternary alloy powder, and a Sn—Ag—Cu—Bi quaternary alloy powder, and the composition of the powder mixture consists of 5-10 mass % of Zn, 0.005-1.5 mass % of Ag, 0.002-1.0 mass % of Cu, 0.005-15 mass % of Bi, and a remainder of Sn.

6. A solder paste as claimed in claim 1 wherein each powder in the powder mixture is selected from a Sn—Zn binary alloy powder, a Sn—Zn—In ternary alloy powder, a Sn—Zn—Cu ternary alloy powder, a Sn—Zn—Cu—In quaternary alloy powder, a Sn—Ag binary alloy powder, a Sn—Ag—Cu ternary alloy powder, a Sn—Ag—In ternary alloy powder, and a Sn—Ag—Cu—In quaternary alloy powder, and the composition of the powder mixture consists of 5-10 mass % of Zn, 0.005-1.5 mass % of Ag, 0.002-1.0 mass % of Cu, 0.005-15 mass % of In, and a remainder of Sn.

7. A solder paste as claimed in claim 1 wherein each powder in the powder mixture is selected from a Sn—Zn binary alloy powder, a Sn—Zn—Bi ternary alloy powder, a Sn—Zn—In ternary alloy powder, a Sn—Zn—Bi—In quaternary alloy powder, a Sn—Ag binary alloy powder, a Sn—Ag—In ternary alloy powder, and a Sn—Ag—Bi—In quaternary alloy powder, and the composition of the powder mixture consists of 5-10 mass % of Zn, 0.005-1.5 mass % of Ag, 0.005-15 mass % of Bi, 0.005 is mass % of In, and a remainder of Sn.

8. A solder paste as claimed in claim 1 wherein each powder in the powder mixture is selected from a Sn—Zn binary alloy powder, a Sn—Zn—Bi ternary alloy powder, a Sn—Zn—In ternary alloy powder, a Sn—Zn—Cu ternary alloy powder, a Sn—Zn—Cu—Bi quaternary alloy powder, a Sn—Zn—Cu—In quaternary alloy powder, a Sn—Zn—Bi—In quaternary alloy powder, a Sn—Zn—Cu—Bi—In five-element alloy powder, a Sn—Ag binary alloy powder, a Sn—Ag—Cu ternary alloy powder, a Sn—Ag—In ternary alloy powder, a Sn—Ag—Cu—Bi quaternary alloy powder, a Sn—Ag—Cu—In quaternary alloy powder, a Sn—Ag—Bi—In quaternary alloy powder, and a Sn—Ag—Cu—Bi—In five-element alloy powder, and the composition of the powder mixture consists of 5-10 mass % of Zn, 0.005-1.5 mass % of Ag, 0.002-1.0 mass % of Cu, 0.005-15 mass % of Bi, 0.005-15 mass % of In, and a remainder of Sn.

9. A solder paste as claimed in claim 1 wherein each powder in the powder mixture is selected from a Sn—Zn binary alloy powder, a Sn—Zn—Sb ternary alloy powder, a Sn—Ag binary alloy powder, and a Sn—Ag—Sb ternary alloy powder, and the composition of the powder mixture consists of 5-10 mass % of Zn, 0.005-1.5 mass % of Ag, 0.005-1.0 mass percent of Sb, and a remainder of Sn.

10. A solder paste as claimed in claim 1 wherein each powder in the powder mixture is selected from a Sn—Zn binary alloy powder, a Sn—Zn—Cu ternary alloy powder, a Sn—Zn—Sb ternary alloy powder, a Sn—Zn—Cu—Sb quaternary alloy powder, a Sn—Ag binary alloy powder, a Sn—Ag—Cu ternary alloy powder, a Sn—Ag—Sb ternary alloy powder, and a Sn—Ag—Cu—Sb quaternary alloy powder, and the composition of the powder mixture consists of 5-10 mass % of Zn, 0.005-1.5 mass % of Ag, 0.002-1.0 mass % of Cu, 0.005-1.0 mass % of Sb, and a remainder of Sn.

11. A solder paste as claimed in claim 1 wherein each powder in the powder mixture is selected from a Sn—Zn binary alloy powder, a Sn—Zn—Bi ternary alloy powder, a Sn—Zn—Sb ternary alloy powder, a Sn—Zn—Bi—Sb quaternary alloy powder, a Sn—Ag binary alloy powder, a Sn—Ag—Sb ternary alloy powder, and a Sn—Ag—Bi—Sb quaternary alloy powder, and the composition of the powder mixture consists of 5-10 mass % of Zn, 0005-15 mass % of Ag, 0.005-15 mass % of Bi, 0.005-1.0 mass % of Sb, and a remainder of Sn.

12. A solder paste as claimed in claim 1 wherein each powder in the powder mixture is selected from a Sn—Zn binary alloy powder, a Sn—Zn—In ternary alloy powder, a Sn—Zn—Sb ternary alloy powder, a Sn—Zn—In—Sb quaternary alloy powder, a Sn—Ag binary alloy powder, a Sn—Ag—In ternary alloy powder, a Sn—Ag—Sb ternary alloy powder, and a Sn—Ag—In—Sb quaternary alloy powder, and the composition of the powder mixture consists of 5-10 mass % of Zn, 0.005-1.5 mass % of Ag, 0.005-15 mass % of In, 0005-1.0 mass % of Sb, and a remainder of Sn.

13. A solder paste as claimed in claim 1 wherein each powder in the powder mixture is selected from a Sn—Zn binary alloy powder, a Sn—Zn—Bi ternary alloy powder, a Sn—Zn—Cu ternary alloy powder, a Sn—Zn—Sb ternary alloy powder, a Sn—Zn—Cu—Bi quaternary alloy powder, a Sn—Zn—Cu—Sb quaternary alloy powder, a Sn—Zn—Bi—Sb quaternary alloy powder, a Sn—Zn—Cu—Bi—Sb five-element alloy powder, a Sn—Ag binary alloy powder, a Sn—Ag—Cu ternary alloy powder, a Sn—Ag—Sb ternary alloy powder, a Sn—Ag—Cu—Bi quaternary alloy powder, a Sn—Ag—Cu—Sb quaternary alloy powder, a Sn—Ag—Bi—Sb quaternary alloy powder, and a Sn—Ag—Cu—Bi—Sb five-element alloy powder, and the composition of the powder mixture consists of 5-10 mass % of Zn, 0.005-1.5 mass % of Ag, 0.002-1.0 mass % of Cu, 0.005-15 mass % of Bi, 0.005-1.0 mass % of Sb, and a remainder of Sn.

14. A solder paste as claimed in claim 1 wherein each powder in the powder mixture is selected from a Sn—Zn binary alloy powder, a Sn—Zn—In ternary alloy powder, a Sn—Zn—Cu ternary alloy powder, a Sn—Zn—Sb ternary alloy powder, a Sn—Zn—Cu—In quaternary alloy powder, a Sn—Zn—Cu—Sb quaternary alloy powder, a Sn—Zn—In—Sb quaternary alloy powder, a Sn—Zn—Cu—In—Sb five-element alloy powder, a Sn—Ag binary alloy powder, a Sn—Ag—Cu ternary alloy powder, a Sn—Ag—In ternary alloy powder, a Sn—Ag—Sb ternary alloy powder, a Sn—Ag—Cu—In quaternary alloy powder, a Sn—Ag—Cu—Sb quaternary alloy powder, a Sn—Ag—In—Sb quaternary alloy powder, and a Sn—Ag—Cu—In—Sb five-element alloy powder, and the composition of the powder mixture consists of 5-10 mass % of Zn, 0.005-1.5 mass % of Ag, 0.002-1.0 mass % of Cu, 0.005-15 mass % of In, 0.005-1.0 mass % of Sb, and a remainder of Sn.

15. A solder paste as claimed in claim 1 wherein each powder in the powder mixture is selected from a Sn—Zn binary alloy powder, a Sn—Zn—Bi ternary alloy powder, a Sn—Zn—In ternary alloy powder, a Sn—Zn—Sb ternary alloy powder, a Sn—Zn—Bi—In quaternary alloy powder, a Sn—Zn—Bi—Sb quaternary alloy powder, a Sn—Zn—In—Sb quaternary alloy powdery a Sn—Zn—Bi—In—Sb five-element alloy powder, a Sn—Ag binary alloy powder, a Sn—Ag—In ternary alloy powder, a Sn—Ag—Sb ternary alloy powder, Sn—Ag—Bi—In quaternary alloy powder, a Sn—Ag—Bi—Sb quaternary alloy powder, a Sn—Ag—In—Sb quaternary alloy powder, and a Sn—Ag—Bi—In—Sb five-element alloy powder, and the composition of the powder mixture consists of 5-10 mass % of Zn, 0.005-1.5 mass % of Ag, 0.005-15 mass % of Bi, 0.005-15 mass % of In, 0.005-1.0 mass % of Sb, and a remainder of Sn.

16. A solder paste as claimed in claim 1 wherein each powder in the powder mixture is selected from a Sn—Zn binary alloy powder, a Sn—Zn—Bi ternary alloy powder, a Sn—Zn—In ternary alloy powder, a Sn—Zn—Cu ternary alloy powder, a Sn—Zn—Sb ternary alloy powder, a Sn—Zn—Bi—In quaternary alloy powder, a Sn—Zn—Cu—Bi quaternary alloy powder, a Sn—Zn—Cu—In quaternary alloy powder, a Sn—Zn—Cu—Sb quaternary alloy powder, a Sn—Zn—Bi—Sb quaternary alloy powder, a Sn—Zn—In—Sb quaternary alloy powder, a Sn—Zn—Cu—Bi—In five-element alloy powder, a Sn—Zn—Cu—Bi—Sb five-element alloy powder, a Sn—Zn—Cu—In—Sb five-element alloy powder, a Sn—Zn—Bi—In—Sb five-element alloy powder, a Sn—Zn—Cu—Bi—In—Sb six-element allay powder, a Sn—Ag binary alloy powder, a Sn—Ag—Cu ternary alloy powder, a Sn—Ag—In ternary alloy powder, a Sn—Ag—Sb ternary alloy powder, a Sn—Ag—Cu—Bi quaternary alloy powder, a Sn—Ag—Cu—In quaternary alloy powder, a Sn—Ag—Bi—In quaternary alloy powder, a Sn—Ag—Cu—Sb quaternary alloy powder, a Sn—Ag—Bi—Sb quaternary alloy powder, a Sn—Ag—In—Sb quaternary alloy powder, a Sn—Ag—Cu—Bi—In five-element alloy powder, a Sn—Ag—Cu—Bi—Sb five-element alloy powder, a Sn—Ag—Cu—In—Sb five-element alloy powder, a Sn—Ag—Bi—In—Sb five-element alloy powder, and a Sn—Ag—Cu—Bi—In—Sb six-element alloy powder, and the composition of the powder mixture consists of 5-10 mass % of Zn, 0.005-15 mass % of Ag, 0.002-1.0 mass % of Cu, 0.005-15 mass % of Si, 0.005-15 mass % of In, 0005-1.0 mass % of Sb, and a remainder of Sn.

17. A solder paste as claimed in claim 1, wherein each powder in the powder mixture is selected from a Sn—Zn binary alloy powder, a Sn—Zn—Bi ternary alloy powder, a Sn—Zn—In ternary alloy powder, a Sn—Zn—Cu ternary alloy powder, a Sn—Zn—Bi—In quaternary alloy powder, a Sn—Zn—Cu—Bi quaternary alloy powder, a Sn—Zn—Cu—In quaternary alloy powder, a Sn—Zn—Cu—Bi—In five-element alloy powder, a Sn—Ag binary alloy powder, a Sn—Ag—Cu ternary alloy powder, a Sn—Ag—In ternary alloy powder, a Sn—Ag—Cu—Bi quaternary alloy powder, a Sn—Ag—Cu—In quaternary alloy powder, a Sn—Ag—Bi—In quaternary alloy powder, and a Sn—Ag—Cu—Bi—In five-element alloy powder, and the composition of the powder mixture consists of 5-10 mass % of Zn, 0.005-1.5 mass % of Ag, one or more selected from the group consisting of 0.002-1.0 mass % of Cu, 0.005-15 mass % of Bi, and 0.005-15 mass % of In, and a remainder of Sn.

18. A solder paste as claimed in claim 17 wherein the amount in the powder mixture of a Sn—Ag binary alloy powder and a Sn—Ag based alloy powder comprising Sn, Ag, and at least one additional element is at most 30 mass % of the powder mixture.

19. A solder paste comprising an alloy powder blended with a flux, wherein the alloy powder is a powder mixture consisting of a plurality of powders each of which is a Sn—Zn based alloy powder not containing Ag or a Sn—Ag based alloy powder not containing Zn, each of the plurality of powders is selected from a Sn—Zn binary alloy powder, a Sn—Zn—Bi ternary alloy powder, a Sn—Zn—In ternary alloy powder, a Sn—Zn—Cu ternary alloy powder, a Sn—Zn—Sb ternary alloy powder, a Sn—Zn—Bi—In quaternary alloy powder, a Sn—Zn—Cu—Bi quaternary alloy powder, a Sn—Zn—Cu—In quaternary alloy powder, a Sn—Zn—Cu—Sb quaternary alloy powder, a Sn—Zn—Bi—Sb quaternary alloy powder, a Sn—Zn—In—Sb quaternary alloy powder, a Sn—Zn—Cu—Bi—in five-element alloy powder, a Sn—Zn—Cu—Bi—Sb five-element alloy powder, a Sn—Zn—Cu—In—Sb five-element alloy powder, a Sn—Zn—Bi—In—Sb five-element alloy powder, a Sn—Zn—Cu—Bi—In—Sb six-element alloy powder, a Sn—Ag binary alloy powder, a Sn—Ag—Cu ternary alloy powder, a Sn—Ag—Bi ternary alloy powder, a Sn—Ag—In ternary alloy powder, a Sn—Ag—Sb ternary alloy powder, a Sn—Ag—Cu—Bi quaternary alloy powder, a Sn—Ag—Cu—In quaternary alloy powder, a Sn—Ag—Bi—In quaternary alloy powder, a Sn—Ag—Cu—Sb quaternary alloy powder, a Sn—Ag—Bi—Sb quaternary alloy powder, a Sn—Ag—In—Sb quaternary alloy powder, a Sn—Ag—Cu—Bi—In five-element alloy powder, a Sn—Ag—Cu—Bi—Sb five-element alloy powder, a Sn—Ag—Cu—In—Sb five-element alloy powder, a Sn—Ag—Bi—In—Sb five-element alloy powder, and a Sn—Ag—Cu—Bi—In—Sb six-element alloy powder, and the composition of the powder mixture consists of 5-10 mass % of Zn, 0.005-1.5 mass % of Ag, 0.005-1.0 mass % of Sb, from zero to three elements selected from the group consisting of 0.002-1.0 mass % of Cu, 0.005-15 mass % of Bi, and 0.005-15 mass % of In, and a remainder of Sn.

* * * * *